United States Patent [19]
Bestenreiner et al.

[11] 3,954,334
[45] May 4, 1976

[54] APPARATUS FOR RECORDING WITH A LENTICULAR GRATING

[75] Inventors: Friedrich Bestenreiner, Grunwald; Reinhold Deml, Munich, both of Germany

[73] Assignee: AGFA-Gevaert, A.G., Leverkusen, Germany

[22] Filed: Mar. 22, 1974

[21] Appl. No.: 453,982

[30] Foreign Application Priority Data
Mar. 31, 1973 Germany............................ 2316196

[52] U.S. Cl.................................... 355/52; 355/71
[51] Int. Cl.².................... G03B 27/68; G03B 27/76
[58] Field of Search ............... 354/112; 355/52, 71, 355/30, 46, 67

[56] References Cited
UNITED STATES PATENTS

| | | |
|---|---|---|
| 2,175,114 | 10/1939 | Friedmann........................... 354/112 |
| 2,566,110 | 8/1951 | Backus................................. 354/112 |
| 3,016,785 | 1/1962 | Kapany................................. 355/52 |
| 3,280,696 | 10/1966 | Ketchian.............................. 355/52 |

*Primary Examiner*—Richard A. Wintercorn
*Attorney, Agent, or Firm*—Michael J. Striker

[57] ABSTRACT

A method and optical arrangement for recording on a light-sensitive surface utilizing a laterally moving lenticular grating. The method aims at achieving gradual tonal or tint variations on the recording medium.

5 Claims, 1 Drawing Figure

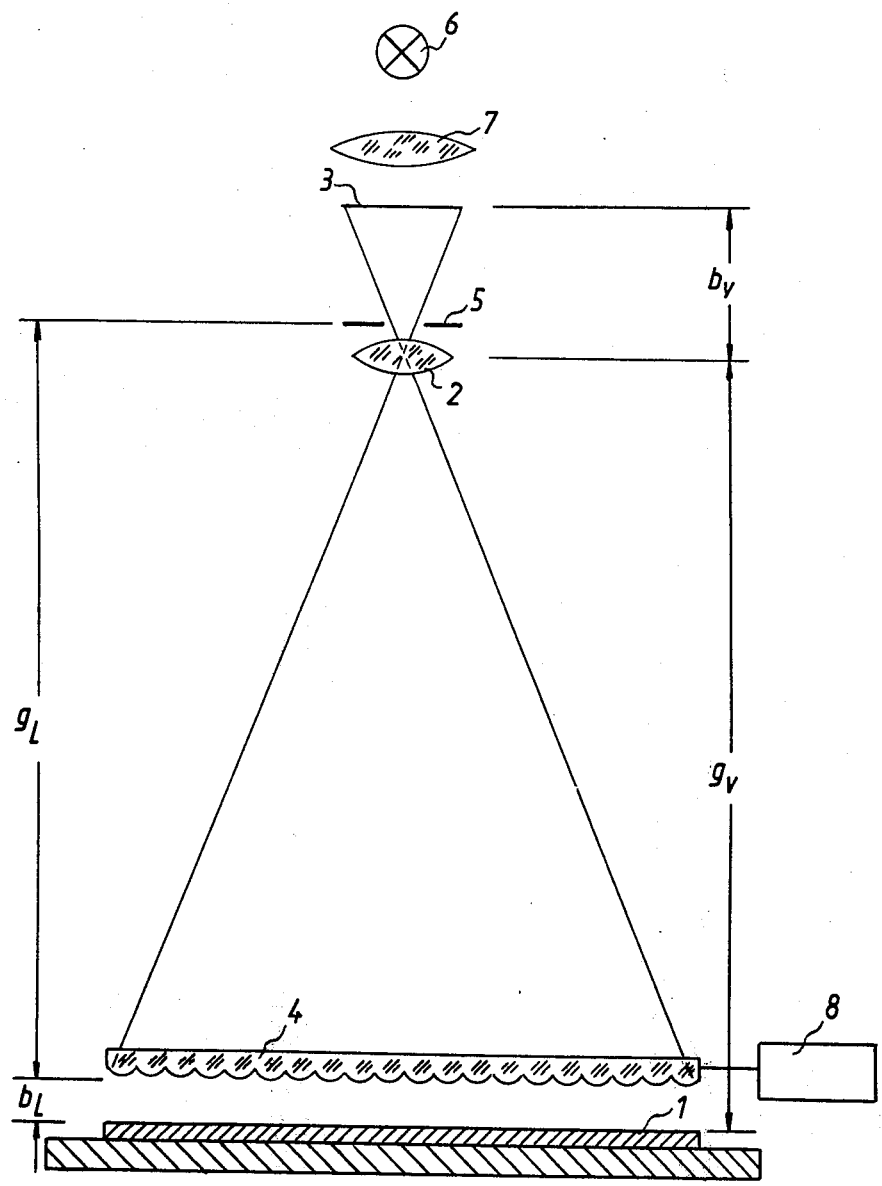

APPARATUS FOR RECORDING WITH A LENTICULAR GRATING

BACKGROUND OF THE INVENTION

The present invention relates to a method and an arrangement for recording on a light-sensitive recording medium, and more particularly to methods and arrangements utilizing an optical element or grating.

It is known to use an optical element or grating for the reproduction of original images on a light-sensitive emulsion or recording medium. Such techniques relate to photolitho and photogravure half-tone processes of reproduction, or in photographic color recording. In these processes continuous tone or tint graduations of the original are replaced by a multiplicity of discrete exposed regions carrying the image of the original.

There are two basic types of lenticular optical elements or gratings: the crossline screen and the contact screen.

In the cross line screen, the surface is generally flat with a pattern of cellular regions superimposed thereon. In the usual embodiment, a sequence of equally spaced parallel lines meet at angles of 90°, dividing the surface of the screen into square cellular areas. The screen is usually set at a predetermined distance in front of the light-sensitive emulsion. One particular application of the crossline screen is in multicolor reprographics in which a gradation in color and tint is formed from a discrete number of initial colors. The disadvantage of the crossline screen is that it is difficult to handle, costly, and results in a low intensity light being transmitted.

The second type of optical element is the contact screen. As the name implies, the screen is in physical contact with the light-sensitive emulsion. One particular application for which the contact screen is therefore not suitable, is in electrophotography.

In multicolor printing or reproduction, it is necessary to change or shift the gratings or screens during the process. In doing so, one is liable to create a Moire pattern in the reproduced image, i.e. an imperfection of wavy lines or geometric shapes in the image caused by a slight offset of two different gratings. Since the pattern will become particularly noticeable after two or more exposures, there is a considerable loss of time and difficulty involved in trying to suppress the pattern during the second or following repetition of the process. Furthermore, the shifting of the gratings requires complicated and expensive machinery.

SUMMARY OF THE INVENTION

It is an object of the invention to provide a method and arrangement for recording on a light-sensitive recording medium utilizing a lenticular optical grating which substantially eliminates the disadvantages of the prior art, and provides an increase in light intensity, the possibility of simple pattern variations, the avoidance of the Moire pattern effect, and improved economy in use.

It is another object of the invention to provide a novel and improved means for forming a fundamental raster pattern on a photosensitive surface utilizing a lenticular grating.

The invention provides a method which involves the steps of directing a beam of image-carrying light at a light-sensitive surface; interposing a lenticular grating in the path of said beam ahead of said light-sensitive surface, and moving said grating transversely of said beam.

The invention further provides a novel and improved arrangement which comprises a lenticular grating, means for laterally moving said grating with reference to a beam of light which passes through the grating, such as a motor or electromagnet, and a photosensitive surface for recording an image or other information by means of the beam of light which has passed through the grating.

The lenticular grating produces a raster on the photosensitive surface, characterized by a raster constant corresponding to the fundamental line frequency, or spatial periodicity, of the raster.

The lateral motion of the grating is preferably controlled so that the total lateral deviation is less than half of the raster constant.

One of the methods as provided by the invention provides for two exposures of the light-sensitive surface. During one exposure, the grating does not move; during the other exposure, the grating moves.

In any other method of exposure as provided by the invention, the grating moves during the entire period of exposure.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWING

The single FIGURE illustrates an optical arrangement with a lenticular grating embodying the invention.

DESCRIPTION OF THE PREFERRED EMBODIMENTS

The single FIGURE shows the recording surface 1 situated in an optical arrangement comprising a light source 6, a condenser lens 7, the original material 3 which is to be copied, a diaphragm 5, and an enlarging lens 2. A lenticular grating 4 is situated between the enlarging lens 2 and the recording surface 1. The recording surface 1 is located on a carrier medium 9.

The distance between the pupil and the grating is labeled $g_L$, that between the grating and the recording surface is labeled $b_L$. The distance between the enlarging lens and the original material is labeled $b_v$; that between the enlarging lens and the recording surface is labeled $g_v$.

The distances $b_L$ and $g_L$ are so regulated that every lens of the lenticular grating 4 images the light emanating from the diaphragm 5 through the enlarging lens 2 onto the recording surface 1. As the diaphragm is illuminated, so will the image points be proportionally likewise represented on the photosensitive surface 1 as a result of the interposition of the grating 4.

A fixed illuminated profile will be directed to the photosensitive surface, or copier material, in which there is a cooperation between the linear gradations on the photosensitive surface depicting the defined image, and the density of the single image points.

By the means embodied in the invention one can average over a larger surface area, and thereby soften the effective density of the image point to the eye of the observer, i.e. for different exposures and different characteristic curves, the outcome will be a single characteristic transmissivity curve for the entire recording surface. The range between the effective and true gradations is available for controlling the gradation range. According to the first embodiment of the invention, in order to achieve a predetermined gradation situated between the true and effective gradation, the exposure is effected in two steps.

During the first exposure period, the grating 4 does not move. In that manner, the tonal (or tint) reproduction will result in a manifestation of effective — yet gentle — gradations in tone. In the second exposure period, the grating 4 will move back and forth in a lateral direction (along the plane of the grating) through the means of a motor or electromagnet 8; shown only diagrammatically because both possibilities are well within the skill of the art. The light peaks of the image points or dots will then be "smeared" over the region of the exposure surface covered by the lateral movement of the raster. The constant intensity of light associated with a particular image dot will be time averaged and diffused over a somewhat larger exposure area.

The tonal reproduction of this latter exposure period will result in characteristic as well as severe tonal gradations in the exposure surface. However, taken together, the first and second exposures will result in a tonal gradation pattern of mean or average degree.

A second embodiment of the invention involves moving the grating 4 during the entire period of exposure, but with the produced gradations being of suitable amplitude. When the amplitude of the deviations is equal to half of the raster constant, the light peaks of the image points will be divided and spread over a larger area. There will be a time-averaging of the constantly illuminated image points and therewith also the harsh or severe characteristic gradations.

With a zero amplitude, on the other hand, the image points will reflect the full, pronounced exposure profile, and consequently a tonal reproduction with milder effective gradations.

While the invention has been illustrated and described as embodied in a method and arrangement for recording with a lenticular grating it is not intended to be limited to the details shown, since various modifications and structural changes may be made without departing in any way from the spirit of the present invention.

Without further analysis, the foregoing will so fully reveal the gist of the present invention that others can, by applying current knowledge readily adapt it for various applications without omitting features that, from the standpoint of prior art, fairly constitutes essential characteristics of the generic or specific aspects of this invention, and therefore, such adaptations should and are intended to be comprehended within the meaning and range of equivalence of the following claims.

What is claimed as new and desired to be protected by Letters Patent is set forth in the appended claims.

We claim:

1. A copying apparatus, comprising, in combination, holding means for holding an original and a photosensitive copying material in spaced predetermined positions stationary relative to each other for the making of a copying exposure; a lenticular grating arranged intermediate the original and the copying material; image forming means operative for illuminating the original; an objective directing light leaving the illuminated original towards the copying material through said lenticular grating to form upon the copying material a raster-like light image of the original; and shifting means for controlling the gradation (reducing the raster-like character) of the image recorded on the copying material (despite the raster-like character of the light image formed thereon) by shifting said grating during the copying exposure relative to the original, the objective and the copying material while the latter remain stationary and by a shift distance less than one half the raster constant of said grating to effect corresponding shifting of the raster-like light image formed upon the copying material during the copying exposure so as to effect a limited and controlled smearing of the image recorded on the copying material and thereby control the gradation of the image recorded on the copying material.

2. A copying apparatus as defined in claim 1, wherein said shifting means comprises means for effecting said shifting of said grating in the plane of said grating.

3. A copying apparatus as defined in claim 1, wherein said shifting means comprises means for effecting a back-and-forth shifting of said grating in the plane of said grating.

4. A copying apparatus as defined in claim 1, wherein said shifting means comprises an electric motor.

5. A copying apparatus as defined in claim 1, wherein said shifting means comprises electromagnetic moving means for effecting the shifting.

* * * * *

UNITED STATES PATENT AND TRADEMARK OFFICE
CERTIFICATE OF CORRECTION

PATENT NO. : 3,954,334

DATED : May 4, 1976

INVENTOR(S) : Friedrich Bestenreiner et al.

It is certified that error appears in the above—identified patent and that said Letters Patent are hereby corrected as shown below:

In item

[30] The serial number of the German application should read:

-- 23 16 195 --.

Signed and Sealed this

First Day of February 1977

[SEAL]

Attest:

RUTH C. MASON
*Attesting Officer*

C. MARSHALL DANN
*Commissioner of Patents and Trademarks*